United States Patent [19]

Miyamoto

[11] Patent Number: 4,849,680
[45] Date of Patent: Jul. 18, 1989

[54] ENCODER

[75] Inventor: Takehiko Miyamoto, Tokyo, Japan

[73] Assignee: Kabushiki Kaisha Empire Airport Service, Tokyo, Japan

[21] Appl. No.: 110,948

[22] Filed: Oct. 20, 1987

[30] Foreign Application Priority Data

Nov. 7, 1986 [JP] Japan ................................. 61-263993
Nov. 7, 1986 [JP] Japan ................................. 61-263995

[51] Int. Cl.⁴ ............................................. G05B 19/29
[52] U.S. Cl. ................................................... 318/602
[58] Field of Search ............... 318/602, 138, 254, 482; 73/1 E, 2, 313, 519; 200/61.2

[56] References Cited

U.S. PATENT DOCUMENTS

| | | | |
|---|---|---|---|
| 3,324,369 | 6/1967 | Markakis | 318/138 |
| 3,670,228 | 6/1972 | Crosby | 318/602 X |
| 4,061,901 | 12/1977 | Saunders et al. | 73/313 X |
| 4,065,968 | 1/1978 | Sunagawa | 73/313 |
| 4,197,489 | 4/1980 | Dunn et al. | 318/138 |
| 4,206,392 | 6/1980 | Shimajiri | 318/602 |
| 4,313,074 | 1/1982 | Nomura et al. | 318/603 X |
| 4,507,590 | 3/1985 | Miyazaki | 318/313 X |
| 4,540,925 | 9/1985 | Jones | 318/602 |
| 4,689,528 | 8/1987 | Watanabe | 318/602 X |
| 4,717,864 | 1/1988 | Fultz | 318/254 |

Primary Examiner—Bentsu Ro
Attorney, Agent, or Firm—Lynn L. Augspurger

[57] ABSTRACT

An absolute-type encoder is coupled to a drive shaft, which is rotatively driven by a motor, for detecting the amount of rotation of the drive shaft. The encoder includes a rotary disk storing position information and rotated in accordance with rotation of the drive shaft, a magnetic head for reading, in the form of a serial signal, the position information stored on the rotary disk, a counter for counting the holding information read by the magnetic head and outputting the information in the form of parallel information, and a battery for supplying operating power to the counter and magnetic head.

2 Claims, 6 Drawing Sheets

ENCODER

BACKGROUND OF THE INVENTION

This invention relates to an encoder used by being directly mounted on the drive shaft of a servomotor or the like.

Along with the advances that have recently been made in the field of robots and automatic machines, encoders which serve as devices for detecting rotational positions and positions along a straight line have come into wide use for the purpose of controlling these robots and machines. A great variety of such encoders are available.

Owing to their structural simplicity and low cost, it is most common to use incremental-type encoders to position servo-mechanisms, particularly the rotating portions thereof.

However, for reasons which will now be set forth, there has recently been an increase in demand for absolute-type encoders. Specifically, when controlling the position of a robot, by way of example, the required processing is to sense a home position first and then use this position as a reference when putting the robot through its motions. (With an incremental-type encoder, this operation is required whenever the power supply is turned on.) If this initializing processing for sensing the home position includes an error, all subsequent motions of the robot will include the error. Accordingly, the initializing operation must be performed with great care and can be troublesome. If an absolute-type encoder is used, these settings need be made only once, after which operation can start immediately regardless of how many times the power supply is turned on and off, providing the contents of the particular job do not change. Thus, with an absolute-type encoder, troublesome initializing processing is not required.

There is increasing demand not only for absolute encoders of the conventional type which detect absolute position for a single revolution but also for absolute encoders capable of detecting absolute position for a large number of revolutions.

With the progress that has recently been made in science and technology, devices which utilize automatic control are becoming increasingly smaller in size, and it is required that the encoders used in these devices also be reduced in size.

A rotary encoder is used by being directly mounted on a servomotor shaft. In the case of the so-called "built-in" type encoder, conventionally the encoder used is of the type which will not cause the motor shaft to develop play in the axial direction. In such an encoder, a rotary disk is directly attached to the shaft or the rotary encoder itself is equipped with a plurality of bearings, whereby the rotary disk is securely mounted without allowing motion of the rotary disk other than rotational motion and in such a manner that other structural portions of the rotary encoder are not adversely affected. The entire arrangement is commonly mounted on the motor shaft directly or through use of couplings or the like.

However, a motor shaft generally has some play in the axial direction and disk motion on the encoder side is limited by bearings arranged in two-point support structure even in the built-in type encoder.

Figure 9:
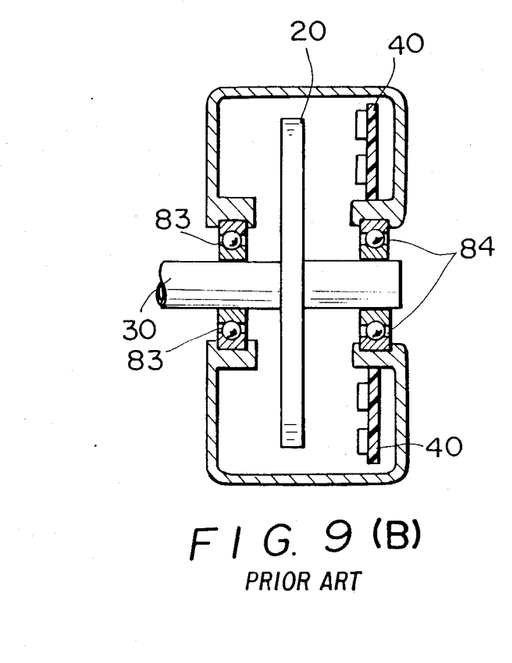

An example of this conventional encoder is shown in FIGS. 9(A), (B), in which numeral 20 denotes a rotary disk, 30 a drive shaft for supporting the rotary disk 20, 40 a control base plate, and 81 through 84 support bearings for the drive shaft 30.

This conventional arrangement has the following problems:

(1) The structure is complicated and costs are high.

(2) If a coupling is not used, the motor shaft and the rotary shaft of the encoder may both be damaged unless the axes of the motor shaft and encoder shaft are in alignment.

(3) If the coupling is used, the cost is raised and play in the coupling has an adverse effect, thereby diminishing accuracy and reliability. Another unavoidable problem is that extra mounting space is required in order to accommodate an increase in length due to the coupling.

SUMMARY OF THE INVENTION

A first object of the invention is to provide an inexpensive absolute rotary encoder through which an absolute position signal can be extracted for number of revolutions.

According to the invention, this first object is attained by providing an absolute encoder coupled to a drive shaft, which is rotatively driven by driving means, for detecting an amount of rotation of the drive shaft, comprising: a rotary disk storing position information and rotated in accordance with rotation of the drive shaft; reading means for reading, in the form of a serial signal, the position information stored on the rotary disk; counting output means for counting and holding information read by the reading means and outputting the information in the form of parallel information; and a battery for supplying operating power to the counting output means and reading means.

In the above-described configuration, an inexpensive and structurally simple absolute encoder can be provided by incorporating the power supply and equipping a mechanism similar to that of the incremental-type encoder with an arrangement for storing detected position information at all times and an arrangement for outputting the stored position information in parallel form.

A second object of the invention is to provide a highly reliable encoder which is simple in construction, easily reduced in size and readily mounted.

According to another embodiment of the invention, this second object is attained by providing an encoder comprising: a rotary disk storing position information at a prescribed interval and fixedly secured to a motor drive shaft for rotating in accordance with rotation of the drive shaft, and reading means including at least two sets of first and second readers spaced apart from each other by a distance approximately the same as a cycle width representing a position information write cycle on the rotary disk, the two sets of readers being spaced apart from each other by a distance which is approximately one-half the interval at which the position information is written on the rotary disk.

Further, the present invention provides an encoder fixedly secured to a motor and fixed to a drive shaft of the motor for detecting an amount of rotation of the drive shaft, comprising: a disk drive shaft having a hollow portion in which the drive shaft of the motor is fitted and retained; a rotary disk storing position information and fixedly secured to the disk drive shaft for rotating in accordance with rotation of the disk drive shaft; reading means for reading the position information stored on the rotary disk; and supporting means disposed adjacent a fixed side of the motor for supporting the disk drive shaft in such a manner that the drive shaft is freely rotatable and fixed against movement in the axial direction.

This arrangement makes it possible to provide an encoder which is inexpensive, simple in construction and small in size.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 9(A), (B) are sectional views of conventional encoders.

DESCRIPTION OF THE PREFERRED EMBODIMENTS

An embodiment of the invention will now be described in detail with reference to the drawings.

Figure 1:
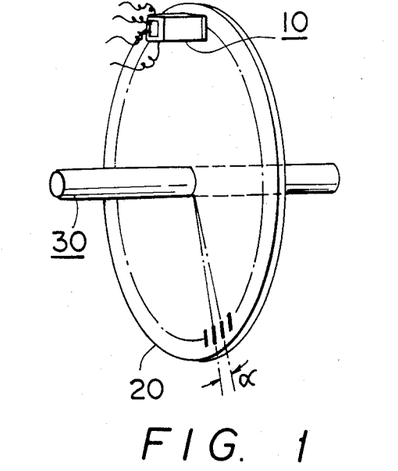
FIG. 1 a perspective view showing the positional relationship between a rotary disk and magnetic head according to the embodiment of the invention.

FIG. 1 illustrates the positional relationship between a rotary disk and a magnetic head according to an embodiment of the invention. Numeral 10 denotes a magnetic head constituted by an M/R element capable of reading and writing, 20; a magnetic disk, and 30; a drive shaft which rotates by an amount corresponding to the amount of movement of an object under control. The magnetic head 10 is disposed at a circumferential surface of the rotary disk 20 having a predetermined radius or at a position opposing this circumferential surface. The surface of the disk 20 on at least a circumferential portion thereof having a predetermined radius is coated with a magnetic material possessing a strong coercive force.

Figure 2:
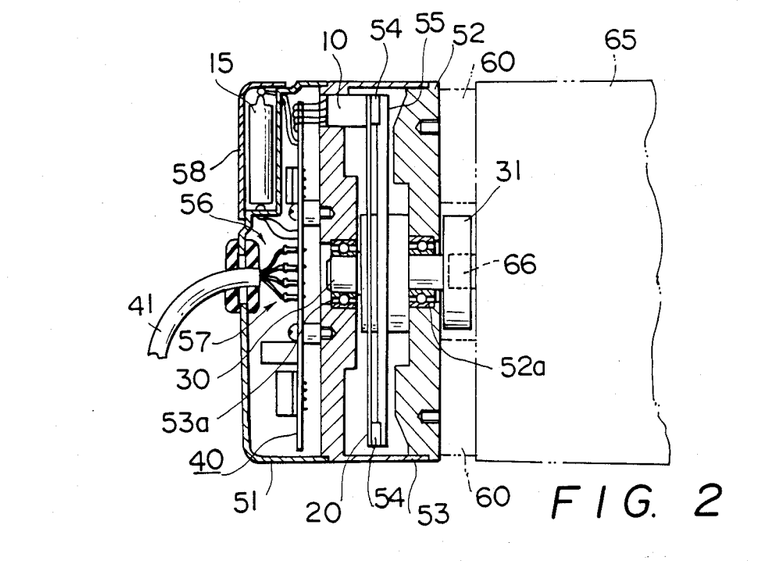
FIG. 2 is a sectional view of an embodiment of the invention.

FIG. 2 is a sectional view showing an encoder incorporating the magnetic head 10 and rotary disk 20.

In FIG. 2, numeral 10 denotes the magnetic head shown in FIG. 1, and numeral 15 represents a chargeable secondary battery for constantly supplying power to a control substrate 40 for read control of the magnetic head 10. Numeral 20 denotes the rotary disk shown in FIG. 1, 30; the drive shaft for rotating the rotary disk 20 and supporting the disk at its center of rotation, 40; the aforementioned control substrate, 41; an interface cable, 51; a protective cover for protecting the control substrate 40, and 52, 53; a support base and main support base, respectively, for rotatably supporting the drive shaft 30. Numerals 52a, 53a denote bearings into which the drive shaft 30 is inserted to be rotatably journaled on the support base 52 and main base 53. Numeral 54 designates a ring-shaped, sponge-like resilient body for bringing the magnetic disk 20 into pressing contact with the magnetic head 10 at a predetermined contact pressure, and numeral 55 represents a back plate for supporting the resilient body 54. Numeral 58 denotes a protective cover for the secondary battery 15, 60; a joint portion and 65; a motor having a drive shaft 66.

In the present embodiment, operating power is supplied to the control substrate 40 via the interface cable 41 when power is being supplied to the motor 65. The control substrate 40 is operated primarily by this electric power fed thereto. At the same time, power is supplied to the battery 15 to automatically charge it if such charging is required. If the operating power for the motor 65 and the like is turned off, the operating power supplied to the encoder through the interface cable 41 also is cut off, after which specific circuits (described below) on the control substrate 40 receive power from the battery 15.

The magnetic head 10 is equipped with reading head portions 10a, 10b (FIG. 3) for two corresponding tracks, as will be described later. Magnetic graduations spaced apart by a certain fixed angle are written beforehand through a well-known method on one magnetic recording track disposed on the magnetic material surface of the rotary disk 20 on the portion thereof opposing the reading head portion 10a of magnetic head 10, and a reference position signal Z indicating a rotational reference position of the magnetic disk 20 is written on the other magnetic recording track disposed on the magnetic material surface of disk 20 opposing the other reading head portion 10b.

Figure 3:
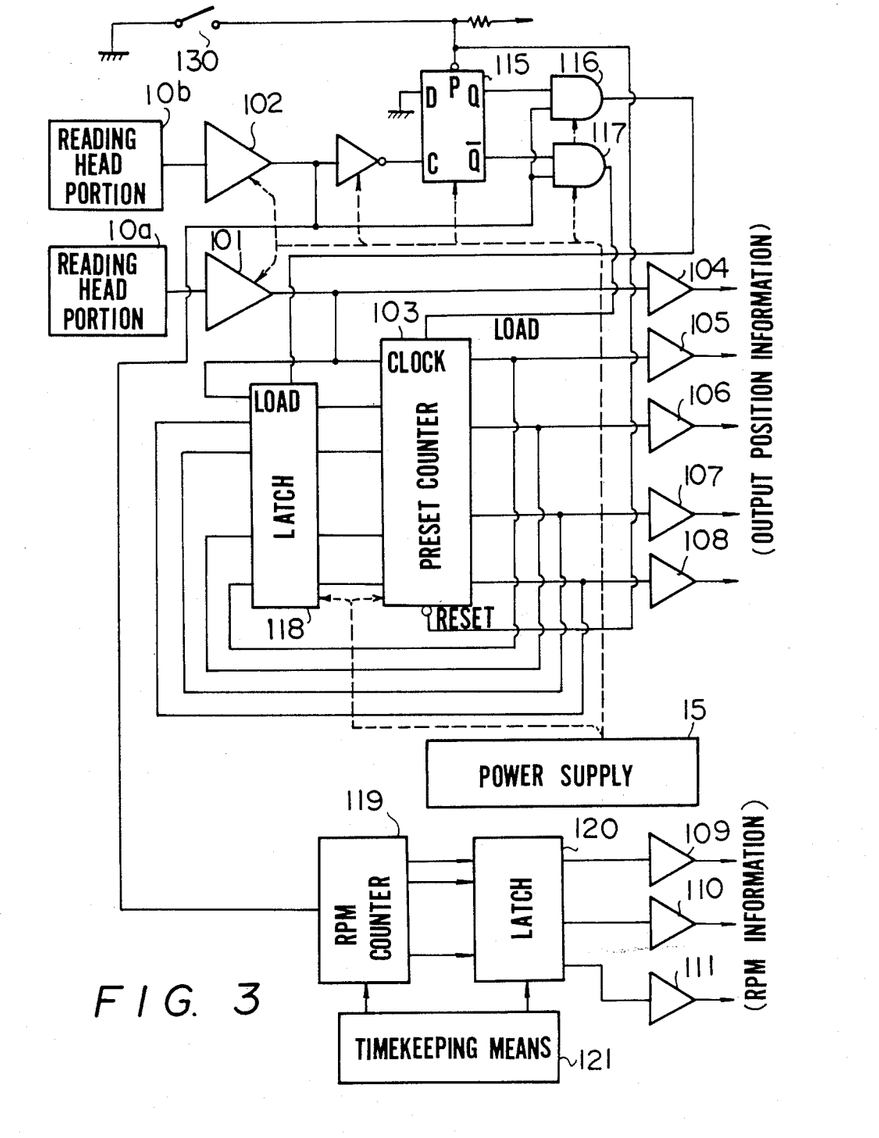
FIG. 3 is circuit diagram of a control substrate according to the embodiment of the invention.

The circuit arrangement of control substrate 40 is illustrated in FIG. 3. The arrangement includes amplifier circuits 101, 102 for amplifying read signals from the reading head portions 10a, 10b, respectively. A counter 103 counts position information (an A signal), indicative of the position of rotary disk 20, which is received in serial form from the read head portion 10a upon being amplified by the amplifier circuit 101. The recorded count is outputted in parallel fashion. Numerals 104 through 111 denote buffers. The counter 103 can have any capacity, depending upon the resolution of the position information stored on the rotary disk 20, and it will suffice if individual parallel position information having one-to-one correspondence with respect to each item of position information on the magnetic disk 20 is outputted. Specifically, parallel information "0", "1", ... "n−1", "n" is outputted, and each value has one-to-one correspondence with respect to the positions at which the position information is written on the rotary disk 20.

Numeral 115 denotes a D-type flip-flop (F/F) set by an input from a reset switch 130 and having its D terminal held at ground level. As a result, the F/F 115 is reset at the clock timing, namely the timing of the negative-going transition of the Z-signal (the clock input) from the read head portion 10b. Numerals 116, 117 denote AND gates. The AND gate 116 outputs a pulse synchronized to the Z-signal at the arrival of the Z-signal when the F/F 115 is in the set state. The AND gate 117 outputs a pulse synchronized to the Z-signal at the arrival of the Z-signal when the F/F 115 is in the reset state. A latch circuit 118 latches, as reference position information, the count in counter 103 at the first arrival of the Z-signal following an input from the reset switch 130. Thereafter, the latch circuit 118 presets the counter 103 to the previously latched position information whenever the Z-signal arrives. Thus, the output position information can be made "0" at any timing in response to an input from the reset switch 130, and it is possible to correct an error each time one revolution is made.

With the exception of the buffers 109 through 111, the above components constantly receive power from the secondary battery 15. Thus, even if the driving power is cut off, the data in latch circuit 118 and the count recorded by counter 103 will be preserved. Furthermore, even if the rotary disk 20 rotates during this period, the accompanying rotational position information will always be updated so that correct information indicative of the absolute position of rotary disk 20 can always be outputted. Accordingly, the encoder can be handled externally just as an absolute encoder merely by providing an incremental encoder mechanism and equipping control circuitry with a power supply and a circuit for forming absolute position information indicative of the absolute position of the rotary disk from the position information thereon, and for storing the absolute position information at all times.

In the present embodiment, the aforementioned control circuitry includes an rpm counter 119, a latch circuit 120 and timekeeping means 121. The rpm counter 19 counts the number of Z-signals which arrive within a specified period of time (e.g. 1 min) decided by the timekeeping means 120, and the value of the count which prevails at elapse of the specified time period is latched by the latch circuit 120 before being outputted via buffers 109 through 111. Thus, an output indicative of the rpm of rotary disk 20 can be obtained. Furthermore, at elapse of the specified time period, the rpm counter 119 is reset and counts the number of Z-signals within the fixed period of time.

These circuits can be arranged to receive power at all times from the battery 15 or only when power is supplied to the driving source.

As mentioned above, the primary battery 15 is placed in a charging state when power is supplied to the driving source and assumes a discharging state when power is not connected to the driving source. However, the battery 15 is not limited to a secondary battery and obviously can be a primary battery. In such case, an arrangement can be adopted in which the supply and removal of power from the battery to the above circuits is performed by changing over a switch. It is also permissible to effect control in such a manner that the switch is changed over to supply power to each of the circuits by cutting off power to the driving source, and to halt the supply of power to these circuits when power is being supplied to the driving source.

In accordance with the present embodiment as described above, even if the basic portion of the encoder is of the incremental type, the encoder functions as an absolute-type encoder as seen from the outside. In addition, since the encoder operates electronically, the initial position (the "0" position) can be set at will and an output of rpm can be obtained.

When a secondary battery is used as set forth above, it becomes necessary to provide a space capable of accommodating the battery. Yet, with the progress that has recently been made in science and technology, devices which utilize automatic control are becoming increasingly smaller in size, and it is required that the encoders used in these devices also be reduced in size. A second embodiment of the invention for satisfying these requirements will now be described with reference to the drawings. In this embodiment, the secondary battery 15 is omitted.

Figure 4:
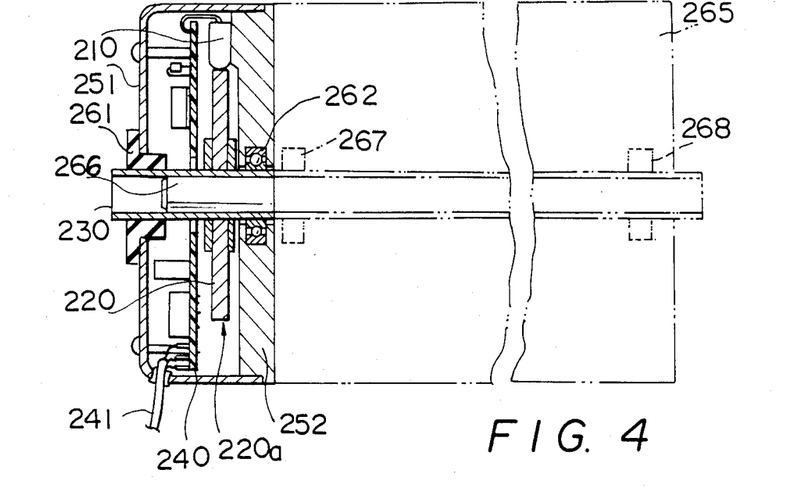
FIG. 4 is a sectional view of a second embodiment of the invention.

FIG. 4 is a sectional view of the second embodiment, in which portions similar to those in FIG. 1 are designated by like reference numerals and need not be described again. Numeral 210 denotes a magnetic head constituted by an M/R element capable of reading and writing. The magnetic head consists of two sets of readers, as will be described hereinbelow. Numeral 220 denotes a rotary disk, which is slightly different from the rotary disk 20 of FIG. 1. The rotary disk 220 has an outer peripheral surface 220a coated with a magnetic material possessing a strong coercive force and having position information written thereon at predetermined intervals. The magnetic head 210 is disposed at a position opposing the outer peripheral surface of the rotary disk 220.

Numeral 230 denotes a drive shaft for rotating the rotary disk 220 and supporting the disk at its center of rotation. The drive shaft 230 has a hollow structure into which a drive shaft 266 of a motor 265 is snugly fitted, so that the drive shaft 230 will rotate in accordance with the rotation of the drive shaft 266.

Numeral 240 denotes a control substrate, 241; an interface cable, and 251; a protective cover for protecting the control substrate 240. In this embodiment, the control substrate 240 is attached to the protective cover 251. The drive shaft 230 is passed through the protective cover 251 and is supported by a bushing 261 fitted into the protective cover 251 until assembly is completed. At the completion of assembly, the bushing 261 is removed so that nothing will impede the rotation of the drive shaft 230. Numeral 252 denotes a support base for rotatably supporting the drive shaft 230. The magnetic head 210 is fixedly secured to the support base 252, in which support bearings 262 are arranged for securing and supporting the drive shaft 230 but allowing the drive shaft to rotate freely.

The support base 252 is secured to the motor 265 and the drive shaft 266 of the motor is fitted into the hollow drive shaft 230, as mentioned above. When this is done, the drive shaft 266 is retained at a prescribed position by the bearings 262 and by support bearings 267, 268 incorporated in the motor 265. The drive shaft 230 is supported at a prescribed accuracy by the bearing 262 and bushing 266 until assembly of the encoder is completed.

Figure 5:
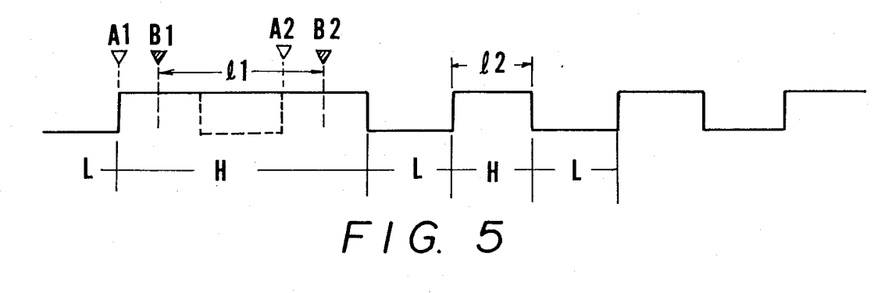
FIG. 5 is a view showing the positional relationship between sensors of a magnetic head and positions at which positional information is written according to the second embodiment.

The magnetic head 210 comprises four sensors A1, A2, B1, B2. The relationship between these sensors and the position information written on the rotary shaft 220 is illustrated in FIG. 5. Specifically, the magnetic head 210 comprises two sets of sensors, namely A-phase signal sensors A1, A2 and B-phase signal sensors B1, B2. The A-phase signal sensors A1 and A2 are spaced apart from each other by a distance equivalent to a cycle width $l_1$ representing the position information write cycle. The B-phase signal sensors B1 and B2 are similarly spaced apart from each other by a distance equivalent to $l_1$. Further, the two sets of sensors are spaced apart from each other by a distance equivalent to about one-half a recording width $l_2$ for a single item of position information on the rotary disk 220. When this position information is read by the sensors constituting the magnetic head 210, an output is obtained from the magnetic head and consists of "H" and "L" levels alternating at a fixed period, as shown in FIG. 5.

Reference position information (Z-position information) is written on the outer peripheral surface 220a of rotary disk 220 at one location thereon. As shown in FIG. 5, information is written between all of the ordinary items of position information. One "L" level is made an "H" level and this serves as the reference position information (Z-position information).

Figure 6:
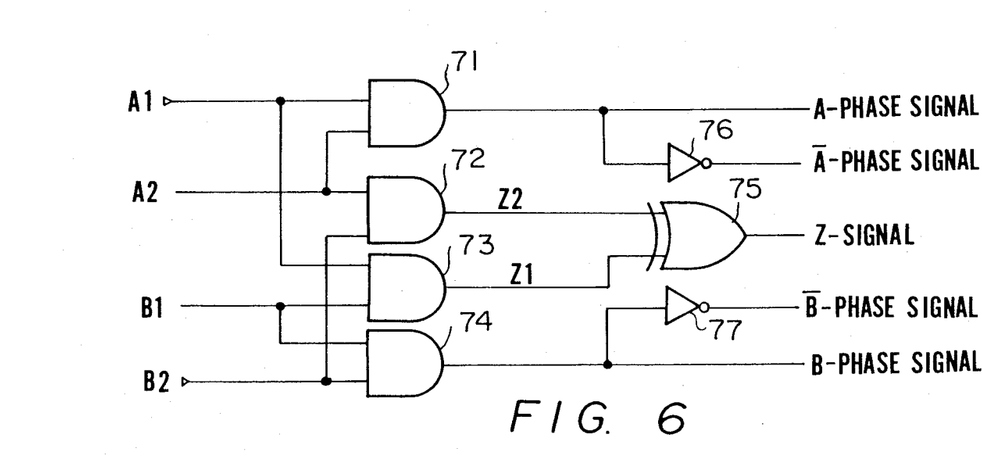
FIG. 6 is a circuit diagram of an output circuit according the second embodiment.

FIG. 6 illustrates an output circuit on control substrate 240 for producing position detection timing signals from read signals generated by the sensors constituting the magnetic head 210.

As shown in FIG. 6, the output circuit includes AND gates 71 through 74, an exclusive-OR gate 75, and inverters 76, 77. The read outputs from the sensors A1, A2, B1, B2 having the positional relationship shown in FIG. 5 are inputted to the output circuit of FIG. 6. The outputs of sensors A1, A2 enter the AND gate 71, which outputs an A-phase signal. The outputs of sensors B1, B2 enter the AND gate 74, which outputs a B-phase signal. These A- and B-phase signals are inputted to the respective inverters 76, 77, which output them as $\overline{A}$- and $\overline{B}$-phase signals, respectively. These signals are the same as the two-phase signals used by an ordinary encoder. With the above-described arrangement, each of the phase signals can be obtained exactly the same as before even when the location at which the reference position information (the Z-position information) is read.

The outputs of the sensors A1 and B1 are inputted to the AND gate 73, which outputs a Z1 signal. The outputs of the sensors A2 and B2 are inputted to the AND gate 72, which outputs a Z2 signal. The Z1 and Z2 signals are applied to the exclusive-OR gate 75, the output of which is a Z signal. Thus, the Z signal is outputted only at the position of the reference position information (the Z-position information).

More specifically, it will suffice to provide the outer peripheral surface of the rotary disk 220 with only a single recording line. In the case of the conventional rotary disk, which has the two A and B phases as one recording line as well as a recording line for sensing the Z signal, the disk is required to have a thickness of 10 mm or more. By providing only one recording line as in the present embodiment, disk thickness can be reduced to 4 mm. The reason for this is that the conventional disk requires that a space be provided between the two line thicknesses to separate them.

In accordance with this second embodiment of the invention as described above, three signals, namely the A, B and Z signals can be extracted using only a single recording line. This makes it possible to provide a very small-sized, thin encoder.

Figure 8:
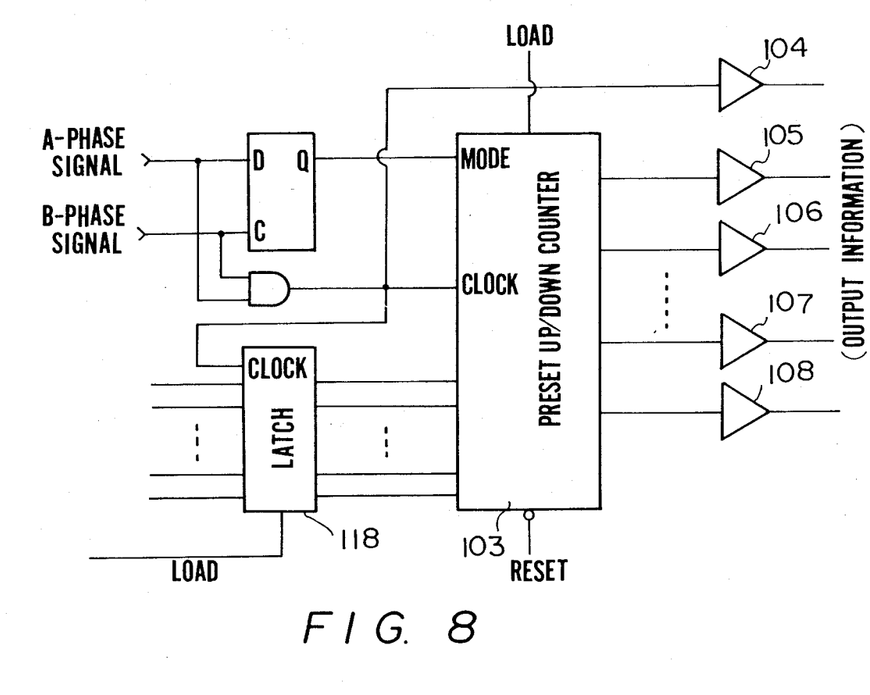
FIG. 8 is a circuit diagram of a portion of a control substrate according to another embodiment of the invention.

The direction of rotation can be sensed depending upon the detection timing of the A- and B-phase signals. If the order is detected to be the A-phase signal and then the B-phase signal, then this will indicate forward-direction detection timing, by way of example. If the order is detected to be the B-phase signal and then the A-phase signal, then this will indicate reverse-direction detection timing. Accordingly, it will suffice if the preset counter 103 of FIG. 3 is constituted by an up/down counter, in which case the counter would count up in the case of forward rotation and count down in the case of reverse rotation, depending upon the direction sensed by the above-described arrangement for sensing the rotating direction. FIG. 8 illustrates the circuitry related to the preset counter in a case where the configuration just described is adopted. In FIG. 8, a mode input terminal MODE controls the up/down counting function of the counter, shown at numeral 103. The counter 103 counts up when a "1" is applied to the mode input terminal and down when a "0" is applied.

Figure 7:
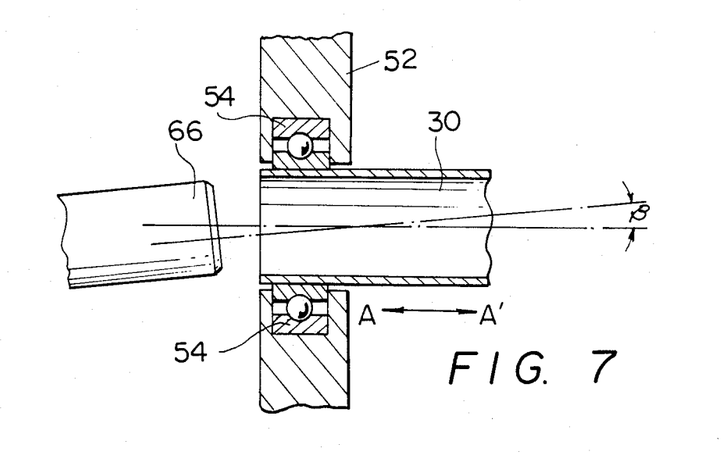
FIG. 7 is a view for describing assembly tolerance according to the second embodiment.

In accordance with the second embodiment, the shaft of the encoder is supported at only a single point by adopting a radial ball bearing support arrangement. This has the following advantages:

(1) As shown in FIG. 7, some degree of freedom is obtained in terms of assembly. Though small, this is equivalent to the mounting tolerance ($\beta$) of the axis of bearing 162. This greatly facilitates the mounting operation. Moreover, movement in the axial direction (A—A' direction) can be suppressed.

(2) In comparison with double shaft support, only one bearing is required. This reduces cost.

(3) A coupling is unnecessary, so that there is no adverse influence from coupling play or the like. In addition, reliability is enhanced.

(4) The encoder can be reduced in size and thickness.

By constructing the magnetic head 210 to have two sets of readers a prescribed distance apart, the well-known two-phase signals can be sensed with a small number of magnetic tracks, thus enabling a further reduction in size. As a result, even if the encoder is equipped with a secondary battery of large size, the overall encoder can still be miniaturized.

As many apparently widely different embodiments of the present invention can be made without departing from the spirit and scope thereof, it is to be understood that the invention is not limited to the specific embodiments thereof except as defined in the appended claims.

What is claimed is:

1. An absolute-type encoder coupled to a drive shaft for detecting an amount of rotation of the drive shaft when said drive shaft is rotatively driven by a driving means, comprising:
   an encoder case,
   a drive shaft journaled for rotation within said case,
   rotary magnetic disk means for storing prevailing rotational position information of said drive shaft on a data storage track of said rotary magnetic disc means and being coupled to said drive shaft to be rotated in accordance with rotation of the drive shaft;
   reading means for reading serial phase signals recorded as said rotational positional information by said rotary magnetic disk means, counting output means including a counter for counting and holding said serial phase signals read by said reading means and outputting the read serial phase signals from said counting output means as parallel information signals;
   a reset signal means and a latch circuit means are provided for presetting said counter to a previously latched position information setting whenever a clock input signal is sensed by said latch circuit means and for resetting an output position information setting at any timing in response to an input from the reset signal means for correcting any error in count each time one revolution of the disk of said rotary magnetic disk means is made;
   data preservation means for preserving the data in said latch circuit means and the count recorded by said counter in the event drive power is cut off; and
   wherein signal detection means is provided for determining the direction of shaft rotation from stored information on a timing track on said rotary magnetic disk means, said counting output means being counted up or down in accordance with the direction in which the drive shaft rotates.

2. An encoder according to claim 1 wherein said reading means includes two reading heads, said two reading heads being so positioned that an initialized position can be determined by a logical evaluation of the output of said reading means.

* * * * *